US009343376B1

(12) United States Patent
Yang

(10) Patent No.: US 9,343,376 B1
(45) Date of Patent: May 17, 2016

(54) METHOD OF FABRICATING A SEMICONDUCTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/872,162

(22) Filed: Oct. 1, 2015

(30) Foreign Application Priority Data

Aug. 19, 2015 (TW) .............................. 104126915 A

(51) Int. Cl.
H01L 21/00 (2006.01)
H01L 21/84 (2006.01)
H01L 29/06 (2006.01)
H01L 21/02 (2006.01)
H01L 29/78 (2006.01)
H01L 21/308 (2006.01)
H01L 21/265 (2006.01)
H01L 29/423 (2006.01)

(52) U.S. Cl.
CPC .......... *H01L 21/84* (2013.01); *H01L 21/02521* (2013.01); *H01L 21/02529* (2013.01); *H01L 21/02532* (2013.01); *H01L 21/02603* (2013.01); *H01L 21/26506* (2013.01); *H01L 21/308* (2013.01); *H01L 29/0649* (2013.01); *H01L 29/0673* (2013.01); *H01L 29/42392* (2013.01); *H01L 29/7848* (2013.01)

(58) Field of Classification Search
CPC ............ H01L 29/42392; H01L 29/775; H01L 29/66439; H01L 29/0669; H01L 29/66818; H01L 29/78696; H01L 29/0673; H01L 21/02603; B82Y 10/00; B82Y 40/00
USPC ............. 257/24, E21.404, E21.245; 438/157; 977/762, 938
See application file for complete search history.

(56) References Cited

U.S. PATENT DOCUMENTS

| 7,902,541 B2 | 3/2011 | Sekaric et al. | |
|---|---|---|---|
| 8,901,672 B1 | 12/2014 | Cheng et al. | |
| 2011/0133163 A1* | 6/2011 | Bangsaruntip | B82Y 10/00 257/24 |
| 2014/0034908 A1* | 2/2014 | Bangsaruntip | H01L 29/775 257/27 |

* cited by examiner

*Primary Examiner* — Brook Kebede
(74) *Attorney, Agent, or Firm* — Winston Hsu; Scott Margo

(57) ABSTRACT

A method of fabricating a semiconductor device includes following steps. First of all, a first nanowire structure and a second nanowire structure are formed on a substrate. Next, a compressive stress layer is formed on the first nanowire structure, and the first nanowire structure is driven to a compressive nanowire structure. Then, a tensile stress layer is formed on the second nanowire structure, and the second nanowire structure is driven into a tensile nanowire structure.

18 Claims, 6 Drawing Sheets

US 9,343,376 B1

METHOD OF FABRICATING A SEMICONDUCTOR DEVICE

BACKGROUND OF THE INVENTION

1. Field of the Invention

The invention relates to a method of forming a semiconductor device, and more particularly, to a method of forming a semiconductor device having a nanowire structure.

2. Description of the Prior Art

Manufacturing a conventional planar metal-oxide-semiconductor (MOS) transistor has difficulty when scaling down to 65 nm and below. Therefore the non-planar transistor technology such as fin field effect transistor (FinFET) technology that allows smaller size and higher performance is developed to replace the planar MOS transistor. For example, dual-gate FinFET device, tri-gate FinFET device, and omega-FinFET device have been provided. Furthermore, a gate-all-around (GAA) nanowire FET device is progressed for achieving the ongoing goals of high performance, low cost, increased miniaturization of integrated circuit components, and greater packaging density of integrated circuits.

SUMMARY OF THE INVENTION

It is one of the primary objectives of the present invention to provide a forming method of a semiconductor device, in which a nanowire structure is formed, so as to achieve preferable performance.

To achieve the purpose described above, the present invention provides a method of fabricating a semiconductor device including following steps. First of all, a first nanowire structure and a second nanowire structure are formed on a substrate. Next, a compressive stress layer is formed on the first nanowire structure, and the first nanowire structure is driven to a compressive nanowire structure. Then, a tensile stress layer is formed on the second nanowire structure, and the second nanowire structure is driven into a tensile nanowire structure.

Through the method of forming a semiconductor device of the present invention, an epitaxial layer is firstly formed on the single crystal silicon containing nanowire structure, and a driving process is performed then. With such performance, the epitaxial layer may react with oxygen and transfer into an oxide layer, and the epitaxial layer may also experience condensation simultaneously, thereby driving the compressive stress materials (like SiGe or Ge, for example) or tensile stress materials (like SiC, SiP, or SiCP, for example) inwardly into the nanowire structure. Thus, a great amount of the compressive stress/tensile stress materials from the epitaxial layer may accumulate in the nanowire structures to form a compressive stress nanowire structure or a tensile stress nanowire structure, so as to provide requested stress to the channel of the gate-all-around transistor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic diagrams illustrating a method of forming a semiconductor device according to one preferred embodiment of the present invention, wherein FIG. 2 shows a cross-sectional view taken along the cross line A-A' in FIG. 1 and FIG. 6 shows a cross-sectional view taken along the cross line B-B' in FIG. 5.

DETAILED DESCRIPTION

To provide a better understanding of the present invention, preferred embodiments will be described in detail. The preferred embodiments of the present invention are illustrated in the accompanying drawings with numbered elements.

Figure 1:
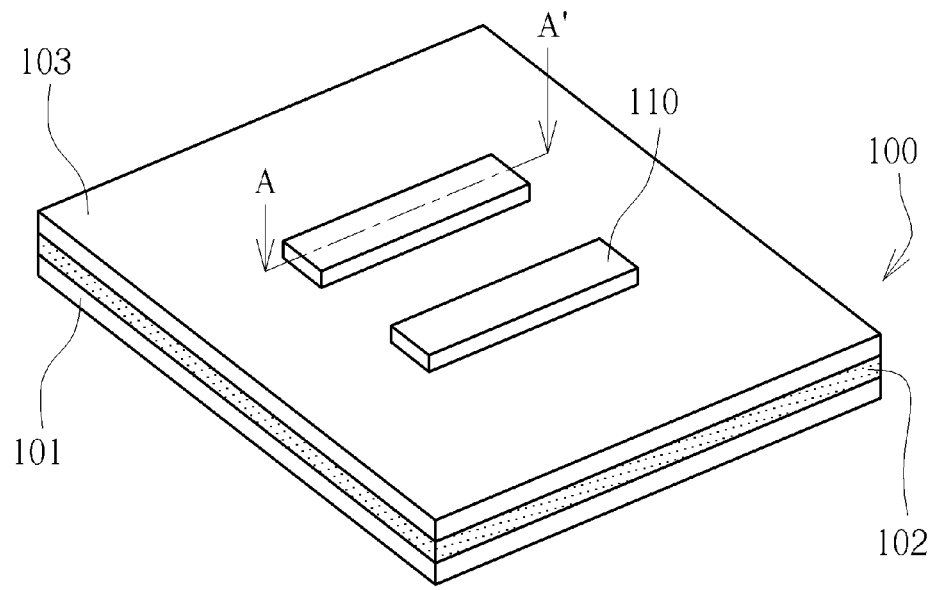
Figure 2:
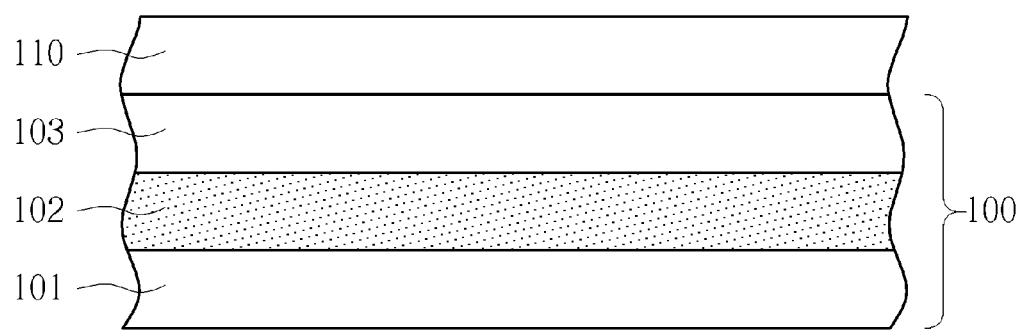

Please refer to FIG. 1 to FIG. 10, which are schematic diagrams illustrating a method of forming a semiconductor device according to one preferred embodiment of the present invention. First of all, a substrate 101 is provided, and an insulating layer 102 and a semiconductor layer, like a single crystal silicon layer 103 for example, may be sequentially formed on the substrate 101. The substrate 101, the insulating layer 102 and the single crystal silicon layer 103 may commonly compose a silicon-on-insulator (SOI) substrate, as shown in FIG. 1. Next, at least one mandrel 110 may be formed on the silicon-on-insulator substrate 100. The mandrel 110 may include silicon oxide or other materials having etching selectivity relative to the materials of the silicon-on-insulator substrate 100 (for example, the single crystal silicon layer 103), such as polysilicon or silicon oxide. Precisely speaking, each mandrel is preferably spaced from each other, such that, a pitch may be performed between any two of the adjacent mandrels 110, as shown in FIG. 1, but not limited thereto.

Figure 3:
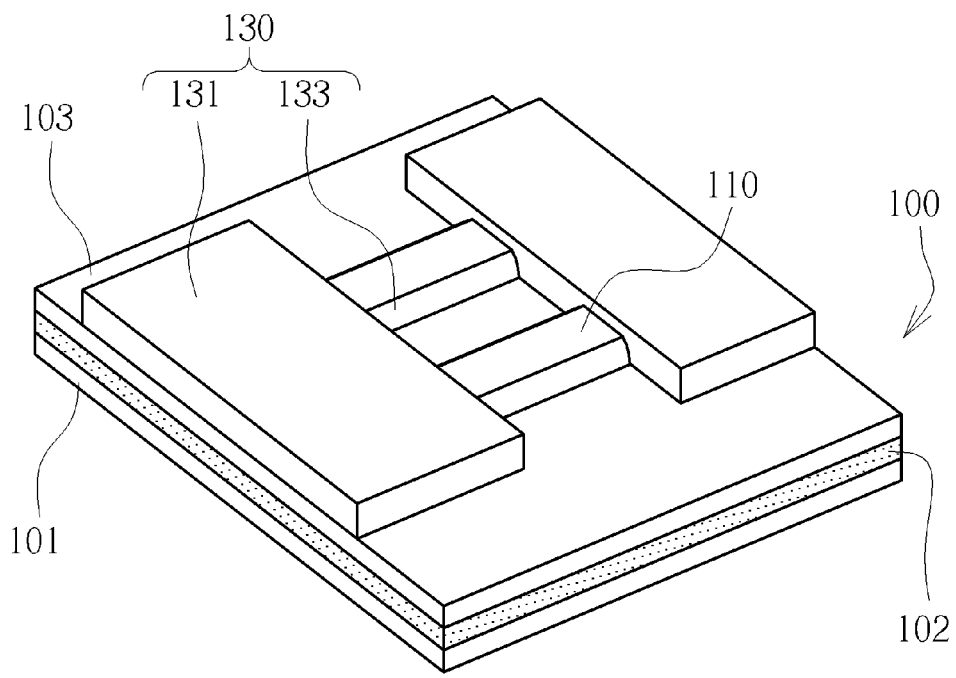

Next, a hard mask layer 130 is formed on the silicon-on-insulator substrate 100, to configure as a mask of defining the nanowire structure formed subsequently. The hard mask layer 130 may include silicon nitride or other materials having etching selectivity relative to the materials of the silicon-on-insulator substrate 100 (for example, the single crystal silicon layer 103). The formation of the hard mask layer 130 may include firstly forming a mask material layer (not shown in the drawings) on the silicon-on-insulator substrate 100 to cover the silicon-on-insulator substrate 100 and the mandrels 110, and a photolithography and etching process is performed to partially remove the mask material layer, thereby forming the hard mask layer 130 covered a portion of the mandrels 110. It is noted that, the hard mask layer 130 may include a connection portion 131 covering each mandrel 110, and an extension portion 133 being adjacent to sidewalls of each mandrel 110 for surrounding them, as shown in FIG. 3.

Figure 4:
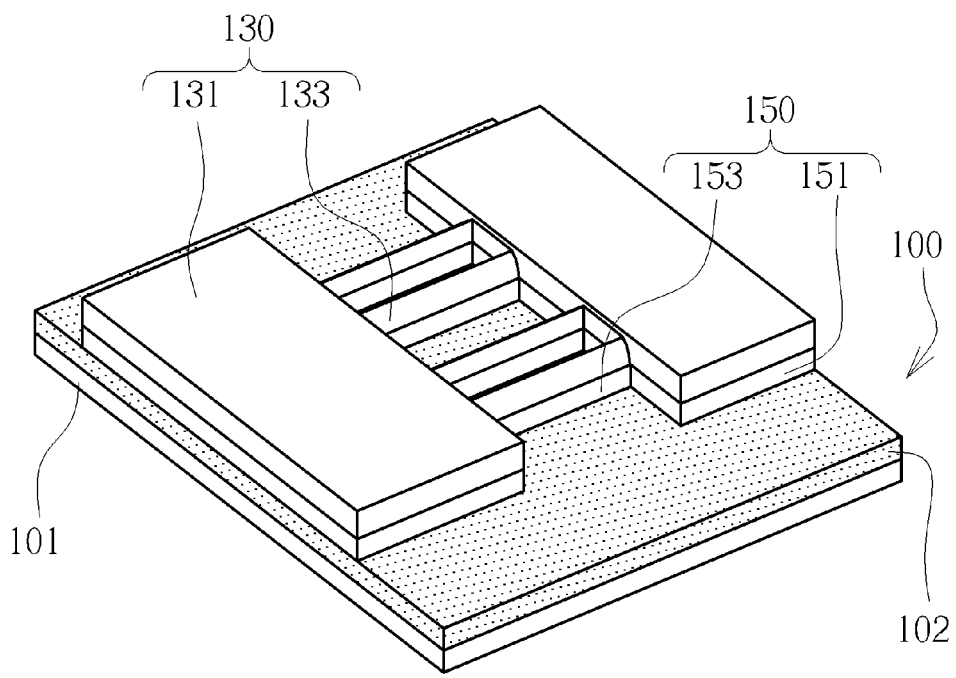

Then, the mandrels 110 are removed, and an etching process is performed by using the hard mask layer 130 as a mask. Though such performance, a portion of the single crystal silicon layer 103 may be removed, so as to form a nanowire structure 150 in the single crystal silicon layer 103 of the silicon-on-insulator substrate 100. The nanowire structure 150 may include two connection pads 151, which may be used as a source/drain structure, and at least one nanowire 153 formed between the connection pads 151. Precisely speaking, a two-step etching process may be performed after the mandrels 110 are removed, for example including firstly performing an anisotropic etching process or a vertical etching process, such as dry etching, to expose the insulating layer 102 of the silicon-on-insulator substrate outside the hard mask layer 130, as shown in FIG. 4. In one embodiment, while performing the anisotropic etching process or the vertical etching process, the parameters of the etching process may be preferably adjusted to form undercut, and the hard mask layer 130 is then removed. Following that, an isotropic etching process or a lateral etching process may be performed, such as wet etching, to further etch sidewalls of the nanowire structure 150. However, people skilled in the art shall easily realize the etching process of the present invention is not limited to the aforementioned steps, and may include other methods. In another embodiment, the two-step etching process may also be performed sequentially both using the hard mask layer 130 as a mask, to form a nanowire structure (not shown in the drawings) having connection pads (not shown in the drawings) and a nanowire (not shown in the drawings) leveled with each other, and the hard mask layer 130 is removed then.

Figure 5:
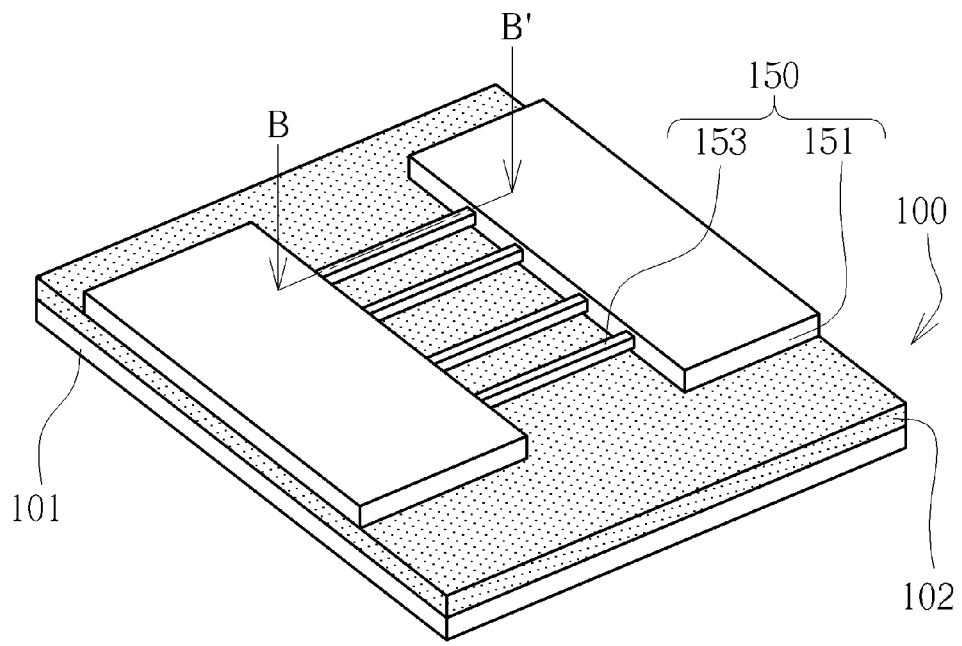
Figure 6:
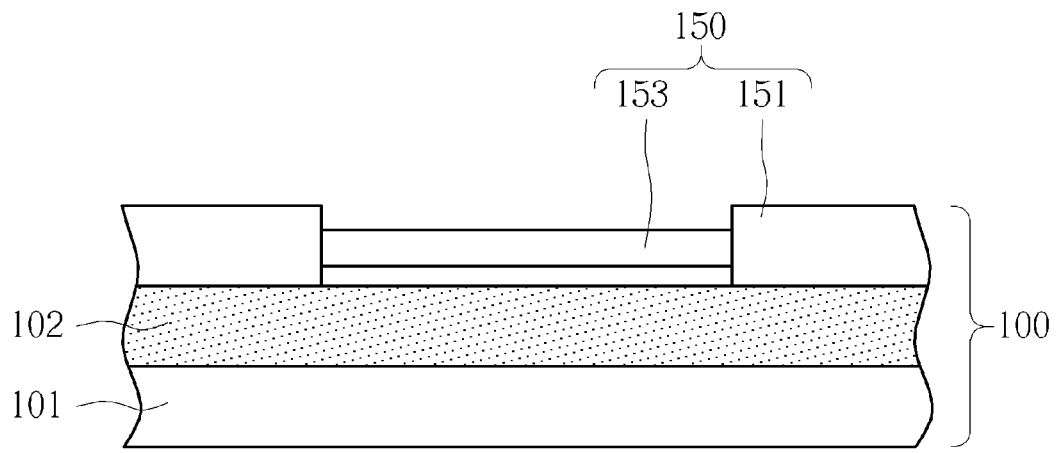

It is worth noting that, while performing the etching process, the hard mask layer 130 may shelter the nanowire structure 150, so that, the single crystal silicon layer 103 adjacent to the hard mask layer 130 may be etched relatively slower, and the single crystal silicon layer 103 away from the hard mask layer 130 may be etched relatively faster. On the other hand, since the nanowire 153 has a relatively small size compared to that of the connection pads 151, the single crystal silicon layer 103 thereof away from the hard mask layer 130 may easily experience bottom cutting while two sides of the nanowire 153 are both etched isotropically. In other words, a portion of the nanowire 153 adjacent to the insulating layer 102 may be removed, and only the portion of the nanowire 153 adjacent to the hard mask layer 130 may remain to form the nanowire 153 across between the connection pads 151, as shown in FIGS. 5-6. Also in another embodiment, a portion of the insulating layer 102 may also be further removed optionally, so that, the nanowire 153 may further space apart from the insulating layer 102 and a gate structure formed subsequently may completely surround the nanowire 153.

Figure 7:
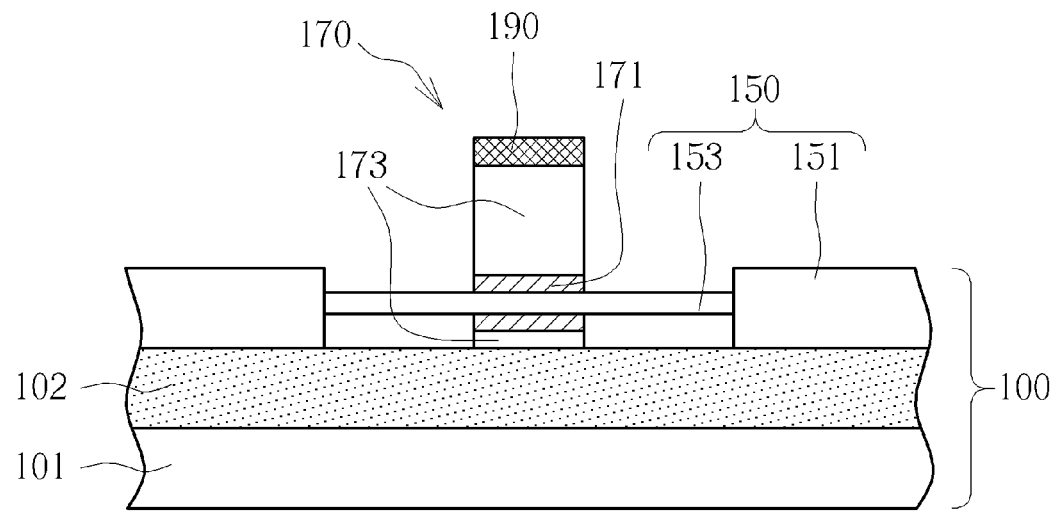

In the following, a gate structure 171 cross the nanowire 153 may be formed. Precisely, the formation of the gate structure 171 may include sequentially forming a gate dielectric layer (not shown in the drawings), like silicon oxide, silicon nitride, silicon oxynitride or other suitable high dielectric constant materials, for example, and a gate layer (not shown in the drawings), like polysilicon, silicide or some suitable work function metals or metal materials, for example, on the silicon-on-insulator substrate 100 and the nanowire structure 150; forming a patterned mask layer 190; and patterning the gate dielectric layer and the gate lay by using the patterned mask layer 190 as a mask, thereby forming the gate electrode 173 at least partially surrounding the nanowire 153 and the gate dielectric layer 171 disposed between the gate electrode 173 and the nanowire 153, as shown in FIG. 7. In the present embodiment, the gate electrode 173 substantially surrounds about ⅓ to ⅕ of a length of the nanowire 153, but is not limited thereto. In another embodiment, a gate electrode (not shown in the drawings) surrounds the whole of the nanowire 153 may also be formed.

Figure 8:
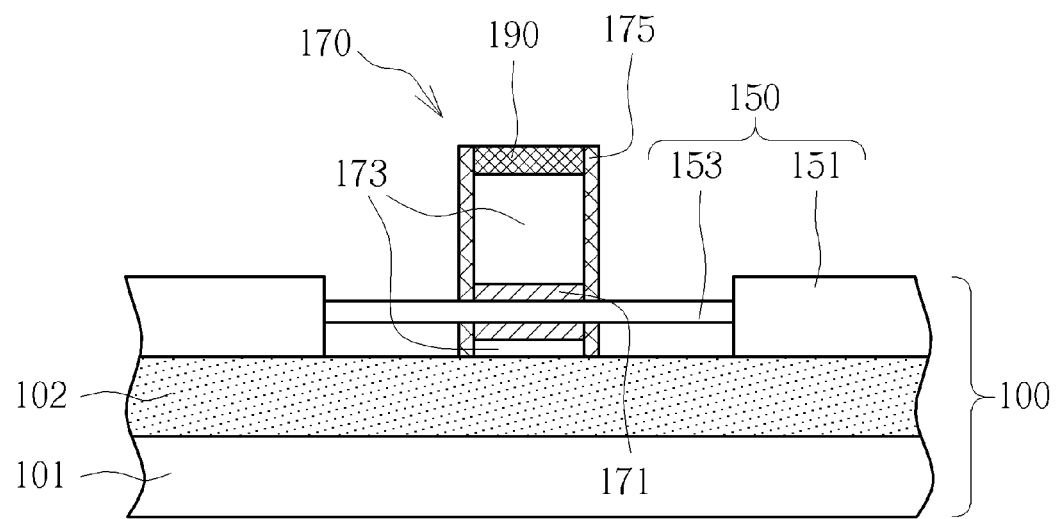

Furthermore, a spacer 175 surrounding the gate structure 170 may be formed, as shown in FIG. 8. The spacer 175 may include a monolayer structure of a multilayer structure of silicon nitride or silicon oxide, and the forming method thereof may be integrated into a conventional semiconductor process or shall be well known in the art, and will not be further detailed herein.

Figure 9:
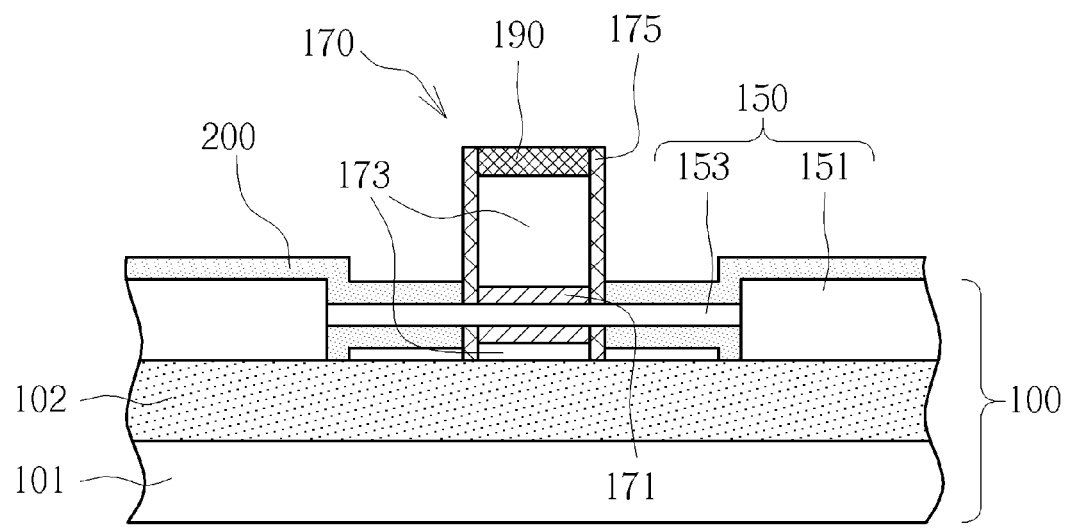

After that, a selective epitaxial growing (SEG) process is performed, to form an epitaxial layer 200 on surfaces of the nanowire structure 150 exposed from the gate structure 170. In the present embodiment, the epitaxial layer 200 may be formed conformally on all exposed silicon surfaces of the nanowire structure 150, as shown in FIG. 9. The epitaxial layer 200 may include different materials according to different conductive types of the metal oxide semiconductor (MOS) transistor formed subsequently. For example, when the MOS transistor is a PMOS, the epitaxial layer 200 may include a material for providing compressive stress to the channel thereof, like silicon germanium (SiGe), or germanium (Ge) for example; otherwise, when MOS transistor is NMOS, the epitaxial layer 200 may include a material for providing tensile stress to the channel thereof, like silicon carbodie (SiC), SiP or SiCP for example, but is not limited thereto.

Figure 10:
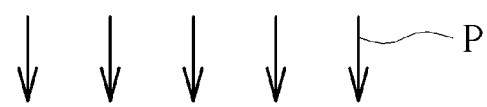
Figure 10:
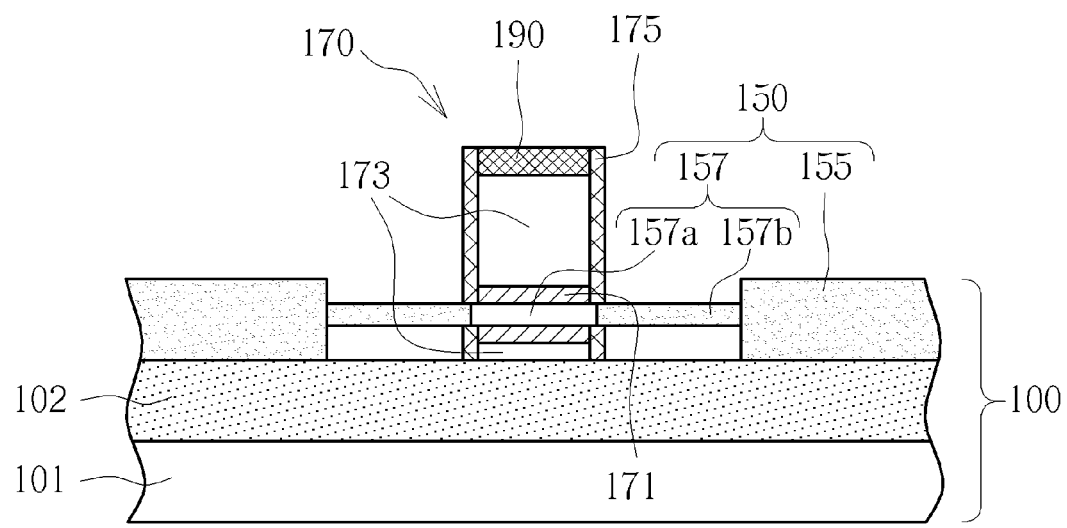

Following these, a driving process P is performed. Precisely speaking, the driving process P may include an annealing process, a rapid thermal annealing process (RTP) or a condensation process. For example, the driving process may be performed under an aerobic environment at about 800° C. to 1100° C., such that, the epitaxial layer 200 may react with oxygen to form an oxide layer (not shown in the drawings). Meanwhile, under such oxidation reaction, the compressive material (SiGe or Ge) or the tensile material (SiC, SiP or SiCP) in the epitaxial layer 200 may experience condensation to gradually drive inward into the nanowire structure 150. In this manner, a great amount of compressive material or tensile material may be accumulated in the nanowire structure 150, so that, the material of a portion of the nanowire structure 150 may be transformed from original single crystal silicon into single crystal silicon compound, thereby forming a compressive nanowire structure or a tensile nanowire structure. Precisely, the compressive nanowire structure or the tensile nanowire structure includes the connection pad 155 and the nanowire structure 157, wherein the nanowire 157 further includes a channel region 157*a* and the compressive/tensile nanowire 157*b* disposed at two sides of the channel region 157*a*, as shown in FIG. 10. In the following, the oxide layer may be optionally removed.

It is worth noting that, in a preferred embodiment, the compressive stress material or the tensile stress material may be uniformly driven into the nanowire structure 150, and reacted with the single crystal silicon, thereby forming the compressive/tensile nanowire 157*b* disposed at two sides of the channel 157*a*, and the connection pad 155, for achieving the purpose of effectively enhancing the carrier mobility of the channel regions. Also, in one embodiment, an implantation process (not shown in the drawings) may be performed while the epitaxial layer 200 is formed, to implant proper dopant into the nanowire structure 150 being uncovered by the gate structure, to form suitable source/drain region (not shown in the drawings), but is not limited thereto. In another embodiment, the implantation process may also be performed after the driving process.

Through the aforementioned steps, the semiconductor device according to one preferred embodiment of the present invention may be obtained, and which includes a gate structure surrounding the nanowire structural channel, so as to perform like a gate-all-around transistor device. Also, through the forming method thereof in the present invention, an epitaxial layer is firstly formed on the single crystal silicon containing nanowire structure, and a driving process is performed then. With such performance, the epitaxial layer may react with oxygen and transfer into an oxide layer, and the epitaxial layer may also experience condensation simultaneously, thereby driving the compressive stress materials (like SiGe or Ge, for example) or tensile stress materials (like SiC, SiP, or SiCP, for example) inwardly into the nanowire structure. Thus, a great amount of the compressive stress/tensile stress materials from the epitaxial layer may accumulate in the nanowire structures to form a compressive stress nanowire structure or a tensile stress nanowire structure, so as to provide requested stress to the channel of the gate-all-around transistor device.

In addition, people in the art shall easily realize that the semiconductor device of the present invention is not limited to be formed through the aforementioned processes, and may also be formed through other forming methods. The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
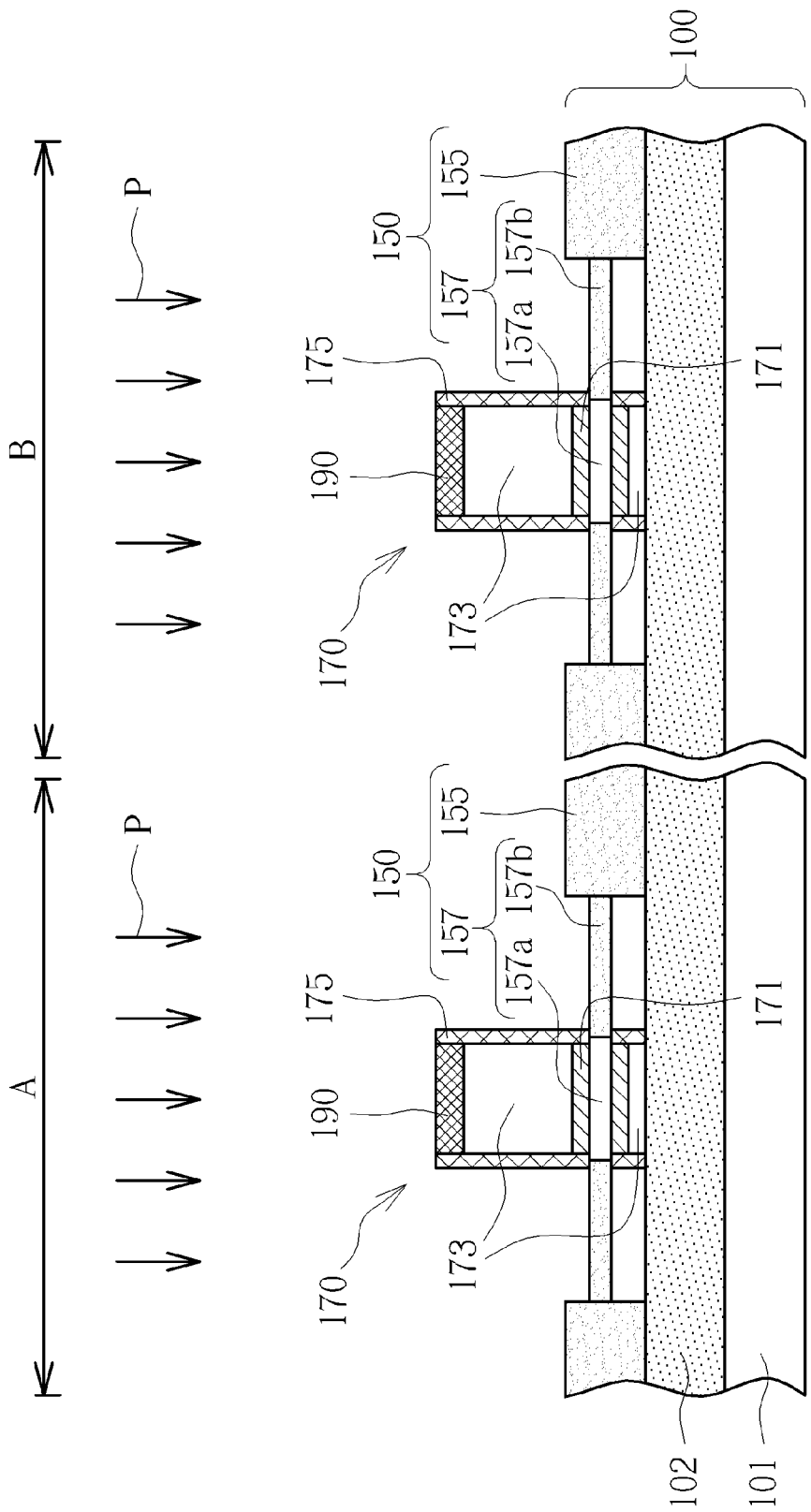
FIG. 11 is a schematic diagram illustrating a semiconductor device according to another one preferred embodiment of the present invention.

Referring to FIG. 11, which is a schematic diagram illustrating a method of forming a semiconductor device according to another embodiment of the present invention. The formal steps in the present embodiment are similar to FIGS. 1-10 in the aforementioned embodiment, and which includes forming the silicon-on-insulator substrate 100 and the nanowire structure 150. However, the differences between the present embodiment and the aforementioned embodiment are that, a first active region A and a second active region B which are electrically isolated from each other are defined on the silicon-on-insulator substrate 100, and the nanowire structure 150 and the gate structure 170 across the nanowire structure 150 shown in FIG. 10 of the aforementioned embodiment are formed both in the first active region A and the second active region B respectively.

Precisely speaking, two gate-all-around transistor devices having different conductive types are formed respectively on the silicon-on-insulator substrate 100 of the first active region A and the second active region B. Also, the gate-all-around transistor devices disposed in the first active region A and the second active region B may include a compressive nanowire structure or a tensile nanowire structure respectively. In other words, after forming the structure shown in FIG. 8 of the aforementioned embodiment, two epitaxial layers (not shown in the drawings) having different materials may be optionally formed in the nanowire structures 150 on the disposed in the first active region A and the second active region B respectively, and the driving process P is performed then. For example, a compressive stress layer (not shown in the drawings, such as a SiGe layer or Ge layer) which may provide compressive stress to the channel thereof may be formed on the nanowire structure 150 in the first active region A; and a tensile stress layer (not shown in the drawings, such as a SiC layer, a SiP layer, or a SiCP layer) which may provide tensile stress to the channel thereof may be formed on the nanowire structure 150 in the second active region B, but is not limited thereto. In another embodiment, two stress layers having different stress materials and the same conductive type (not shown in the drawings) may also be formed on the nanowire structures 150 in the first active region A and the second active region B respectively.

Though the aforementioned steps, the semiconductor device according to another preferred embodiment of the present invention may be obtained. However, people skilled in the art shall easily realize the forming method of the present invention is not limited to the aforementioned processes, and may include other methods. For example, in other variants of the present embodiment, the driving process P of the first active region A and the second active region B may be performed separately. In other words, after forming the structure shown in FIG. 8 of the aforementioned embodiment on the silicon-on-insulator substrate 100 of the first active region A and the second active region B, a mask layer (not shown in the drawings) may be formed, to cover the nanowire structure 150 disposed in the second active region B. In this way, an epitaxial layer shown in FIG. 9 of the aforementioned embodiment (not shown in the drawings) may only be formed on the nanowire structure 150 in the first active region A, for example, an epitaxial layer (such as a SiGe layer or a Ge layer) which may provide compressive stress to the channel thereof, and the driving process P of the first active region A is performed to form the compressive nanowire structure in the first active region A. Following these, after removing the mask layer, another mask layer be formed, to cover the nanowire structure 150 disposed in the first active region A. Then, an epitaxial layer shown in FIG. 9 of the aforementioned embodiment (not shown in the drawings) may only be formed on the nanowire structure 150 in the second active region B, for example, an epitaxial layer (such as a SiC layer, a SiP layer or a SiCP layer) which may provide tensile stress to the channel thereof, and the driving process P of the second active region B is performed to form the tensile nanowire structure in the second active region B. Finally, the oxygen layer (being formed from the epitaxial layer after the driving process P) formed in the two active regions A, B may be removed simultaneously.

According to the above, the forming method of the present embodiment is able to form a complementary metal oxide semiconductor device including the nanowire transistor. Also, through the forming method thereof in the present invention, an epitaxial layer is firstly formed on the single crystal silicon containing nanowire structure, and a driving process is performed then. With such performance, the epitaxial layer may react with oxygen and transfer into an oxide layer, and the epitaxial layer may also experience condensation simultaneously, thereby driving the compressive stress materials (like SiGe or Ge, for example) or tensile stress materials (like SiC, SiP, or SiCP, for example) inwardly into the nanowire structure. Thus, a great amount of the compressive stress/tensile stress materials from the epitaxial layer may accumulate in the nanowire structures to form a compressive stress nanowire structure or a tensile stress nanowire structure, so as to provide requested stress to the channel of the gate-all-around transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming a first nanowire structure and a second nanowire structure on a substrate;
   forming a compressive stress layer on the first nanowire structure;
   performing a first driving process to drive the first nanowire structure into a compressive nanowire structure;
   forming a tensile stress layer on the second nanowire structure; and
   performing a second driving process to drive the second nanowire structure into a tensile nanowire structure.

2. The method of forming a semiconductor device of claim 1, wherein the first driving process and the second driving process are performed through an annealing process, a condensation process or a rapid thermal annealing process.

3. The method of forming a semiconductor device of claim 1, wherein the first driving process and the second driving process are performed simultaneously.

4. The method of forming a semiconductor device of claim 1, wherein the first driving process and the second driving process are performed separately.

5. The method of forming a semiconductor device of claim 1, further comprising:
forming a gate structure across each of the first nanowire structure and the second nanowire structure.

6. The method of forming a semiconductor device of claim 1, wherein each of the compressive nanowire structure and the tensile nanowire structure comprises a channel region and a compressive/tensile nanowire at two sides of the channel region.

7. The method of forming a semiconductor device of claim 5, wherein the gate structure is formed before the first driving process and the second driving process are performed.

8. The method of forming a semiconductor device of claim 5, wherein the gate structure comprises a gate layer surrounding the first nanowire structure and the second nanowire structure, and a gate dielectric layer between the gate layer and the first nanowire structure and the second nanowire structure.

9. The method of forming a semiconductor device of claim 5, further comprising:
forming a spacer structure surrounding the gate structure.

10. The method of forming a semiconductor device of claim 1, wherein the compressive stress layer comprises silicon germanium or germanium.

11. The method of forming a semiconductor device of claim 1, wherein the tensile stress layer comprises SiC, SiP or SiCP.

12. The method of forming a semiconductor device of claim 1, wherein the forming of the first nanowire structure and the second nanowire structure comprises:
forming a hard mask layer on the substrate;
performing a first etching process by using the hard mask layer as a mask; and
performing a second etching process to form the first nanowire structure and the second nanowire structure in the substrate.

13. The method of forming a semiconductor device of claim 12, further comprising:
removing the hard mask layer after the second etching process.

14. The method of forming a semiconductor device of claim 12, further comprising:
removing the hard mask layer after the first etching process.

15. The method of forming a semiconductor device of claim 1, further comprising:
performing an implantation process on the first nanowire structure and the second nanowire structure.

16. The method of forming a semiconductor device of claim 15, wherein the implantation process is performed after the first driving process and the second driving process are performed.

17. The method of forming a semiconductor device of claim 15, wherein the implantation process is performed while the compressive stress layer or the tensile stress layer is formed.

18. The method of forming a semiconductor device of claim 1, wherein the substrate comprises silicon on insulating substrate.

* * * * *